(12) United States Patent
Gasa et al.

(10) Patent No.: US 8,791,033 B2
(45) Date of Patent: Jul. 29, 2014

(54) WAFER BACKSIDE COATING PROCESS WITH PULSED UV LIGHT SOURCE

(71) Applicant: Henkel Corporation, Rocky Hill, CT (US)

(72) Inventors: Jeffrey Gasa, Long Beach, CA (US); Dung Nghi Phan, Long Beach, CA (US); Jeffrey Leon, Long Beach, CA (US); Sharad Hajela, San Carlos, CA (US); Shengqian Kong, Hillsborough, NJ (US)

(73) Assignee: Henkel IP & Holding GmbH, Duesseldorf (DE)

( * ) Notice: Subject to any disclaimer, the term of this patent is extended or adjusted under 35 U.S.C. 154(b) by 0 days.

(21) Appl. No.: 13/707,941

(22) Filed: Dec. 7, 2012

(65) Prior Publication Data

US 2013/0099396 A1    Apr. 25, 2013

Related U.S. Application Data

(63) Continuation of application No. PCT/US2011/039044, filed on Jun. 3, 2011.

(60) Provisional application No. 61/352,584, filed on Jun. 8, 2010.

(51) Int. Cl.
*H01L 21/56* (2006.01)

(52) U.S. Cl.
USPC ........... 438/781; 438/127; 438/758; 438/780; 257/E21.502

(58) Field of Classification Search
USPC .......... 257/783, 793, E21.502; 438/127, 758, 438/780, 781
See application file for complete search history.

(56) References Cited

U.S. PATENT DOCUMENTS

| | | | |
|---|---|---|---|
| 4,208,005 A | 6/1980 | Nate et al. | |
| 5,356,947 A | 10/1994 | Ali et al. | |
| 6,833,629 B2 * | 12/2004 | Ma et al. | 257/790 |
| 7,176,044 B2 | 2/2007 | Forray et al. | |
| 7,455,095 B2 | 11/2008 | Yamamoto | |
| 7,468,292 B2 | 12/2008 | Yamano | |
| 7,473,617 B2 | 1/2009 | Momoi et al. | |
| 7,482,251 B1 | 1/2009 | Paulsen et al. | |
| 7,488,993 B2 | 2/2009 | Tokano et al. | |
| 7,491,772 B2 | 2/2009 | Kamiya et al. | |
| 7,494,845 B2 | 2/2009 | Hwang et al. | |
| 7,494,900 B2 | 2/2009 | Harris et al. | |
| 7,495,315 B2 | 2/2009 | Lee et al. | |
| 7,498,520 B2 | 3/2009 | Osaka et al. | |
| 7,501,300 B2 | 3/2009 | Abe | |
| 7,560,519 B2 | 7/2009 | Canelas et al. | |
| 2004/0102566 A1 | 5/2004 | Forray et al. | |
| 2007/0085216 A1 | 4/2007 | Bauer et al. | |
| 2007/0241436 A1 | 10/2007 | Ookubo et al. | |
| 2008/0176167 A1 | 7/2008 | Kawamori et al. | |

FOREIGN PATENT DOCUMENTS

| | | |
|---|---|---|
| JP | 03039378 A | 2/1991 |
| JP | 2005320491 A | 11/2005 |
| JP | 2007016074 A | 1/2007 |
| JP | 2007100065 A | 4/2007 |
| WO | 8400506 A1 | 2/1984 |
| WO | 2008094149 A1 | 8/2008 |

OTHER PUBLICATIONS

"Pulsed UV Curing Provides User-Friendly Solutions to Tough Problems", pp. 1-3, Louis Panico, Jan. 1997.*
"RC-800 Series: Pulsed UV Curing Systems", Xenon Corporation, 2008.
"If you have a problem with mercury UV curing, we have a better solution. Pulsed UV Light", Xenon Corporation, 2006.

* cited by examiner

*Primary Examiner* — Jasmine Clark
(74) *Attorney, Agent, or Firm* — Steven C. Bauman

(57) ABSTRACT

A process for coating a semiconductor wafer with a coating composition comprises curing the coating with a pulsed UV light, thereby preventing delamination during reflow operations. In a particular embodiment, the coating composition comprises both epoxy and acrylate resins. The epoxy resin can be cured thermally; the acrylate resin is cured by UV irradiation.

8 Claims, No Drawings

WAFER BACKSIDE COATING PROCESS WITH PULSED UV LIGHT SOURCE

FIELD OF THE INVENTION

This invention relates to a process for coating the inactive side (backside) of a semiconductor wafer in which the coating is cured using a pulsed UV light source.

BACKGROUND OF THE INVENTION

Recent advancements in semiconductor packaging have led to the downsizing of the package through the use of thinner dies in a stacked arrangement (two or more semiconductor dies are mounted on top of one another). This stacking of dies enables increased functionality in a small footprint, allowing for downsizing of the overall semiconductor package. Typically, an adhesive paste or film is used between the two semiconductor dies to ensure package integrity during fabrication operations, such as, wirebonding, molding, and solder reflow, and during end use. However, the thinness of the dies makes them susceptible to warping and delamination in the solder reflow step of the fabrication process. Thus, there is a need for a wafer backside coating that can undergo the reflow process and maintain its integrity and functionality.

SUMMARY OF THE INVENTION

This invention is a process for coating a thin semiconductor wafer in which the coating is cured using a pulsed UV light, and is thus able to undergo the subsequent reflow process without delamination. The process comprises: (A) providing a coating composition, (B) disposing the coating composition onto the back side of the wafer; and (C) B-staging curing the coating composition by exposing the composition to pulsed UV light in an amount sufficient to cure the coating composition. In one embodiment, an amount sufficient to cure the coating composition typically ranges from 0.1-10 J/cm$^2$.

In another embodiment this invention is a semiconductor wafer coated with a cured coating composition, in which the coating composition is cured to B-stage by pulsed UV light.

DETAILED DESCRIPTION OF THE INVENTION

As used herein, the term "B-staging" (and its variants) is used to refer to the processing of the coating material by irradiation so that the material is partially cured to a tacky or more hardened state. If the material is a flow-able adhesive, B-staging will provide extremely low flow without fully curing, such that additional curing may be performed after the adhesive is used to join one article to another.

As used herein the term "curing agent" is used to refer to any material or combination of materials that initiate, propagate, or accelerate cure of the composition and includes, but is not limited to, accelerators, catalysts, initiators, and hardeners.

The semiconductor wafer may be any type, size, or thickness as required for the specific industrial use. In particular embodiments, the semiconductor wafer is thin. Currently, within the semiconductor industry, thin wafers are those about 100 microns (μm) thick, although even thinner wafers are being introduced as warpage problems can be solved.

The coating composition can be any wafer backside coating suitable or currently utilized for that purposed. Suitable coating compositions are typically prepared from epoxy resins, and in one embodiment are solid epoxy resins, such as those selected from the group consisting of cresol novolac epoxy, phenol novolac epoxy, bisphenol-A epoxy, and glycidylated resins containing backbones consisting of phenolic and fused rings systems (such as dicyclopentienyl groups). In one embodiment the epoxy resin is present in an amount of 15 to 40 wt % of the coating. In another embodiment the epoxy resin is a solid with a melting point between 80° and 130° C.

Other suitable resins, which can be used in combination with the epoxies, are acrylate resins. Suitable acrylate resins include those selected from the group consisting of butyl (meth)acrylate, isobutyl (meth)acrylate, 2-ethyl hexyl (meth) acrylate, isodecyl (meth)acrylate, n-lauryl (meth)acrylate, alkyl (meth)acrylate, tridecyl (meth)acrylate, n-stearyl (meth)acrylate, cyclohexyl(meth)acrylate, tetrahydrofurfuryl(meth)acrylate, 2-phenoxy ethyl(meth)acrylate, isobornyl (meth)acrylate, 1,4-butanediol di(meth)acrylate, 1.6 hexanediol di(meth)acrylate, 1,9-nonandiol di(meth)acrylate, perfluorooctylethyl (meth)acrylate, 1,10 decandiol di(meth) acrylate, nonylphenol polypropoxylate (meth)acrylate.

Other acrylate resins include polypentoxylate tetrahydrofurfuryl acrylate, available from Kyoeisha Chemical Co., LTD; polybutadiene urethane dimethacrylate (CN302, NTX6513) and polybutadiene dimethacrylate (CN301, NTX6039, PRO6270) available from Sartomer Company, Inc; polycarbonate urethane diacrylate (ArtResin UN9200A) available from Negami Chemical Industries Co., LTD; acrylated aliphatic urethane oligomers (Ebecryl 230, 264, 265, 270, 284, 4830, 4833, 4834, 4835, 4866, 4881, 4883, 8402, 8800-20R, 8803, 8804) available from Radcure Specialities, Inc; polyester acrylate oligomers (Ebecryl 657, 770, 810, 830, 1657, 1810, 1830) available from Radcure Specialities, Inc.; and epoxy acrylate resins (CN104, 111, 112, 115, 116, 117, 118, 119, 120, 124, 136) available from Sartomer Company, Inc.

Further acrylate resins include monocyclic acetal acrylate, (meth)acrylates containing cyclic acetals (such as, SR531 available from Sartomer); THF acrylate (such as, SR285 available from Sartomer); substituted cyclohexy (meth)acrylates (such as, CD420 available from Sartomer); acetoacetoxyethyl methacrylate, 2-acetoacetoxyethyl acrylate, 2-acetoacetoxypropyl methacrylate, 2-acetoacetoxypropyl acrylate, 2-acetoacetamidoethyl methacrylate, and 2-acetoacetamidoethyl acrylate; 2-cyanoacetoxyethyl methacrylate, 2-cyanoacetoxyethyl acrylate, N(2-cycanoacetoxyethyl) acrylamide; 2-propionylacetoxyethyl acrylate, N(2-propionylacetoxyethyl) methacrylamide, N-4-(acetoacetoxybenzyl) phenyl acrylamide, ethylacryloyl acetate, acryloylmethyl acetate, N-ethacryloyloxymethyl acetoacetamide, ethylmethacryloyl acetoacetate, N-allylcyanoacetamide, methylacryloyl acetoacetate, N(2-methacryloyloxymethyl) cyanoacetamide, ethyl-a-acetoacetoxy methacrylate, N-butyl-N-acryloyloxyethyl acetoacetamide, monoacrylated polyols, monomethacryloyloxyethyl phthalate, and mixtures thereof.

In one embodiment, the acrylate is chosen to have a viscosity less than 50 mPas and a boiling point greater than 150° C. In a particular embodiment, acrylate contains a five- or six-membered ring containing at least one oxygen in the ring.

In one embodiment the acrylate resin comprises 15 to 50 wt % of the coating composition.

Suitable curing agents for the epoxy resin are present in an amount between greater than 0 and 50 wt % and include, but are not limited to, phenolics, aromatic diamines, dicyandiamides, peroxides, amines, imidizoles, tertiary amines, and polyamides. Suitable phenolics are commercially available from Schenectady International, Inc. Suitable aromatic diamines are primary diamines and include diaminodiphenyl sulfone and diaminodiphenyl methane, commercially available from Sigma-Aldrich Co. Suitable dicyandiamides are available from SKW Chemicals, Inc. Suitable polyamides are commercially available from Air Products and Chemicals, Inc. Suitable imidazoles are commercially available from Air Products and Chemicals, Inc. Suitable tertiary amines are available from Sigma-Aldrich Co.

Suitable curing agents for acrylate resins are present in an amount between 0.1 to 10% and include, but are not limited to, any of the known acetophenone-based, thioxanthone-based, benzoin-based and peroxide-based photoinitiators. Examples include diethoxyacetophenone, 4-phenoxydichloroacetophenone, benzoin, benzoin ethyl ether, benzoin isopropyl ether, benzyl dimethyl ketal, benzophenone, 4-phenyl benzophenone, acrylated benzophenone, thioxanthone, 2-ethylanthraquinone, etc. The Irgacur and Darocur lines of photoinitiators sold by BASF are examples of useful photoinitiators.

In one embodiment, the coating composition comprises a resin that is thermally curable, and a resin that is curable by free radical polymerization initiated by UV light. In a particular embodiment such a dual cure coating composition will comprise an epoxy resin, which is thermally curable, and an acrylate resin, which is curable upon UV irradiation. One embodiment comprises glycidylated o-cresol formaldehyde novolac as the epoxy resin and trimethylcyclohexyl acrylate as the acrylate resin.

In further embodiments, the coating composition will contain a reactive sulfur compound, such as, a thiol or a dithioester. In one embodiment, the reactive sulfur compounds are selected from the group consisting of dodecyl mercaptan, tertiary dodecyl mercaptan, mercaptoethanol, octyl mercaptan, hexyl mercaptan, isopropyl xanthic disulfide, and mercaptan-pendant siloxane polymer. Reactive sulfur compounds will be present in amounts from 0.1% to 7% by weight of the coating composition.

An example of a mercaptan-pendant siloxane polymer has the following structure

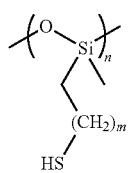

in which n is an integer between 5 and 500 denoting a polymeric number of repeating units, and m is an integer from 1 to 5. The polymeric mercaptan-pendant siloxane will be present in an amount from 0.1 to 7% by weight of the coating composition.

In one embodiment the coating composition comprises (i) a solid epoxy resin with a melting point between 80° and 130° C.; (ii) an acrylate resin having a viscosity less than 50 mPas and a boiling point greater than 150° C.; and (iii) a polymeric mercaptan-pendant silicone having the structure

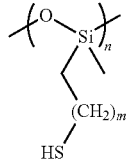

in which n is an integer between 5 and 500, and m is an integer of 1 to 5.

In some embodiments, nonconductive fillers are present. Examples of suitable nonconductive fillers include alumina, aluminum hydroxide, silica, vermiculite, mica, wollastonite, calcium carbonate, titania, sand, glass, barium sulfate, zirconium, carbon black, organic fillers, and organic polymers including but not limited to halogenated ethylene polymers, such as, tetrafluoroethylene, trifluoroethylene, vinylidene fluoride, vinyl fluoride, vinylidene chloride, and vinyl chloride.

In other embodiments, conductive fillers are present. Examples of suitable conductive fillers include carbon black, graphite, gold, silver, copper, platinum, palladium, nickel, aluminum, silicon carbide, boron nitride, diamond, and alumina. The particular type of filler is not critical and can be selected by one skilled in the art to suit the needs of the specific end use, such as stress reduction and bondline control.

Spacers may also be included in the formulation to control the bondline thickness of the bonded part, in types and amounts selected by the practitioner to meet the needs of the particular application.

Fillers and spacers may be present in any amount determined by the practitioner to be suitable for the chosen resin system and end use; typically amounts range between 10 and 30 wt %.

In one embodiment, the fillers are spherical in shape with an average particle diameter of greater than 2 μm and a single peak particle size distribution. Smaller particle sizes and bimodal distributions result in an unacceptably high thixotropic index, which in turn leads to poor spin coating performance and non-uniform coating thickness.

Other additives, including but not limited to adhesion promoters, antifoaming agents, antibleed agents, rheology control agents, and fluxing agents, in types and amounts known to those skilled in the art, may be included in the coating formulation. In a preferred embodiment, solvents are not part of the composition.

The coating can be any thickness required for the appropriate protection, bonding, or processing performance for the particular manufacturing use and would typically be between 12 μm and 60 μm. In one embodiment the coating thickness is 40 μm.

The coating is disposed onto the wafer by any effective means used in the industry, such as, for example, stencil printing, screen printing, spraying processes (ultrasonic, piezoelectric, pneumatic), jetting processes (such as through a thermal or piezoelectric (acoustical) head), or spin-coating.

The coating is B-staged by exposure to a pulsed UV light source at 180 nm to 800 nm, with a total irradiation exposure of 0.01-10 J/cm$^2$. The pulsed UV light source is used at a distance of 12 to 38 cm from wafer to bulb for 15 to 300 seconds.

UV cure processes typically involve absorption of that portion of the light which has wavelengths of <400 nm. A suitable pulsed UV light source is an Xenon lamp (Xenon Corp., Wilmington Mass.).

Suitable parameters for the exposure and lamp will typically fall within the following ranges:

Pulse duration: 1-1000 microseconds measured at ⅓ peak value
Energy per pulse: 1-2000 joules
Radiated time: 0.1-10 seconds
Lamp type: Quartz, Suprasil, or Sapphire
Spectrum: 100-1000 nanometers
Wavelength selection outside the lamp: none or IR filter
Lamp Housing Window: Quartz, Suprasil, or Sapphire

Example

An adhesive composition was formulated as follows. A glycidylated o-cresol formaldehyde novolac (30.32 g) (softening point of 85° C., epoxy equivalent weight of 203) was dissolved in tetrahydrofurfuryl acrylate (15.16 g) at 80° C. The solution was cooled to room temperature and the following components were added: trimethylcyclohexyl acrylate (15.16 g); a photoinitiator mixture (2.39 g) consisting of 2,4,6-trimethylbenzoyl-diphenyl-phosphineoxide and 2-hydroxy-2-methyl-1-phenyl-propan-1-one; 2-phenyl-4-methylimidazole (0.80 g); mercaptan pendant silicone (0.16 g) (molecular weight 4000-7000); and fused silica (16.00 g) (dry sieved at 5 microns). The mixture was hand-mixed the passed four times through a three-roll ceramic mill The adhesive composition was spin coated to 40 micron ($\mu$m) thickness onto three 100 micron ($\mu$m) thick square silicon wafers, 15.24 cm per side. Each wafer was B-staged cured by UV irradiation using a different UV source, with the settings optimized for complete cure.

Lamp A was a Fusion belt-driven mercury lamp using a belt speed of approximately 104 cm/min, an intensity of 0.381 W/cm, and a total exposure of 1.4 J/cm$^2$.

Lamp B was a UVEXS Model 15647-12 belt-driven mercury lamp using a belt speed of approximately 104 cm/min, an intensity of 0.44 W/cm, and a total exposure of 1.4 J/cm$^2$.

lamp C was a Xenon Model RC847-LH830 pulsed UV light source used at a distance of 12.7 cm from wafer to bulb for 60 seconds with a total exposure of 0.36 J/cm$^2$.

UV dicing tape (from Denka) was disposed onto the B-staged adhesive and laminated to the wafers at 1.4 KgF/cm$^2$ (20 psi). The electrical connections on the wafers were solder balls that would be subsequently reflowed. The wafers were then sawed into dies 10 mm×15 mm in size.

The individual dies were picked off the dicing tape and bonded to strips of freshly oven-dried smooth electronic substrate (BT core with soldermask without any metallization) to a total thickness of 250 $\mu$m (microns) using a Toray FC-100M thermal compression bonder (Toray Engineering Co. Ltd.) at 140° C. bond temperature, 15N force, and one second bond time. The substrate and die assemblies were cured in an oven at 150° C. for one hour with a 30 minute ramp.

Scanning acoustic micrographs (SAMs) were taken using a Sonix UHR-2000 instrument (Sonix Inc.). The substrate and die assemblies were transferred to a humidity oven and heated at 85° C. and 85% humidity for 24 hours. The substrate and die assemblies were then passed three times through a reflow oven at 260° C. to reflow the solder and SAMs were again taken.

After cure, all samples, no matter by which lamp cured, showed clean SAMs with no observable voiding or delamination. After the humidity oven and reflow treatment, the samples cured with the fusion mercury lamp A showed gross delamination in all bonded dies. Of those samples cured using the UVEXS lamp, three out of 13 dies failed and showed delamination. Of those samples cured by the Xenon lamp, all showed little change from their original post-thermal cured state. Therefore, the use of the pulsed UV light facilitates and allows the use of thin semiconductor dies, resulting in less damage.

What is claimed:

1. A process for coating a semiconductor wafer with a coating composition comprising:
    (A) providing a coating composition;
    (B) disposing the coating composition onto the semiconductor wafer; and
    (C) B-stage curing the coating composition by exposing the composition to pulsed UV light in an amount sufficient to cure the coating composition,
in which the coating composition comprises (i) a solid epoxy resin with a melting point between 80° C. and 130° C., and (ii) a polymeric mercaptan-pendant silicone having the structure

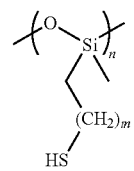

in which n is an integer between 5 and 500, and m is an integer of 1 to 5.

2. The process according to claim 1 in which the coating composition is exposed to a total of 0.1 to 10 J/cm$^2$ of UV radiation from a pulsed UV light source.

3. The process according to claim 1 in which the pulsed UV light source is used at a distance of 12 to 38 cm from wafer to bulb for 15 to 300 seconds.

4. The process according to claim 1 in which the semiconductor wafer is 100 $\mu$m or less in thickness.

5. The process of claim 1 in which the coating composition comprises a resin that can be cured thermally and a resin that can be cured by free radical polymerization.

6. The process of claim 5 in which the resin that can be cured thermally is an epoxy resin and the resin that can be cured by free radical polymerization is an acrylate resin.

7. A semiconductor wafer coated using the process of claim 1.

8. A semiconductor wafer coated using a process for coating a semiconductor wafer with a coating composition comprising:
    (A) providing a coating composition;
    (B) disposing the coating composition onto the semiconductor wafer; and
    (C) B-stage curing the coating composition by exposing the composition to pulsed UV light in an amount sufficient to cure the coating composition,
in which the coating composition comprises (i) a solid epoxy resin with a melting point between 80° C. and 130° C., and (ii) an acrylate resin having a viscosity less than 50 mPas and a boiling point greater than 150° C.

* * * * *